United States Patent
Nakaya

(10) Patent No.: US 8,390,321 B2
(45) Date of Patent: Mar. 5, 2013

(54) RECONFIGURABLE LOGICAL CIRCUIT

(75) Inventor: Shogo Nakaya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/138,643

(22) PCT Filed: Feb. 19, 2010

(86) PCT No.: PCT/JP2010/001105
§ 371 (c)(1),
(2), (4) Date: Sep. 14, 2011

(87) PCT Pub. No.: WO2010/106738
PCT Pub. Date: Sep. 23, 2010

(65) Prior Publication Data
US 2012/0007633 A1 Jan. 12, 2012

(30) Foreign Application Priority Data
Mar. 18, 2009 (JP) ................. 2009-065741

(51) Int. Cl.
*H03K 19/173* (2006.01)
(52) U.S. Cl. .......................... 326/38; 326/41
(58) Field of Classification Search .............. 326/38–41, 326/46, 52, 54
See application file for complete search history.

(56) References Cited

U.S. PATENT DOCUMENTS

| | | | | |
|---|---|---|---|---|
| 6,130,553 A * | 10/2000 | Nakaya | ............................ | 326/39 |
| 7,447,726 B2 * | 11/2008 | Kershaw et al. | .............. | 708/625 |
| 7,911,230 B1 * | 3/2011 | Schleicher et al. | ............. | 326/41 |
| 2003/0001613 A1 | 1/2003 | Nakaya | | |
| 2005/0055395 A1 | 3/2005 | Nakaya | | |
| 2005/0275427 A1 * | 12/2005 | Wang et al. | ...................... | 326/41 |
| 2009/0243652 A1 * | 10/2009 | Dorairaj et al. | ................. | 326/38 |

FOREIGN PATENT DOCUMENTS

| | | |
|---|---|---|
| JP | 11-122096 A | 4/1999 |
| JP | 3185727 B2 | 5/2001 |
| JP | 2003-84967 A | 3/2003 |

OTHER PUBLICATIONS

International Search Report dated Apr. 13, 2010 (English Translation Thereof).

* cited by examiner

*Primary Examiner* — Don Le
(74) *Attorney, Agent, or Firm* — McGinn IP Law Group, PLLC

(57) ABSTRACT

Provided is a reconfigurable logic circuit that can effectively use a preposition logic that composes a logic block. The reconfigurable logic block according to the present invention includes a plurality of logic blocks (199) having a full adder (30), two preposition logics (20) that perform a plurality of logic operations according to configuration data, an extended logic block (60) that can perform the logic operation of one or more kinds. Outputs (21A and 21B) of the preposition logic are respectively connected to two argument inputs (A and B) of the full adder (30). A carry output (CO) of the full adder (30) is connected to the extended logic block (60). One selected from a plurality of signals including a fixed logic value is input to a carry input (CI) of the full adder according to the configuration data, and the extended logic block of other logic block generates an output signal according to an output of the extended logic block.

20 Claims, 16 Drawing Sheets

| INPUT TERMINAL | I0 | I1 | I2 | I3 | LOGIC FUNCTION |
|---|---|---|---|---|---|
| INPUT SIGNAL | 0 | I1 | I2 | 0 | I1, I2 AND |
| | 0 | I1 | I2 | 1 | I1, I2 NAND |
| | 1 | I1 | I2 | 0 | I1, I2 (NOR-like with bubble on I2) |
| | 1 | I1 | I2 | 1 | I1, I2 (AND with bubble on I1) |
| | I0 | 1 | I2 | 0 | I0, I2 OR |
| | I0 | 1 | I2 | 1 | I0, I2 NOR |
| | I0 | 0 | I2 | 0 | I0, I2 (AND with bubble on I2) |
| | I0 | 0 | I2 | 1 | I0, I2 (OR with bubble on I0) |
| | I0 | X | 0 | I3 | I0, I3 XOR |
| | X | I1 | 1 | I3 | I1, I3 XNOR |
| | 1 | 0 | I2 | I3 | I2, I3 XNOR |
| | I0 | I1 | I2 | 0 | I0, I1, I2 MUX (0/1) |
| | I0 | I1 | I2 | 1 | I0, I1, I2 MUX (0/1) with bubble |

Fig. 7

Fig. 14
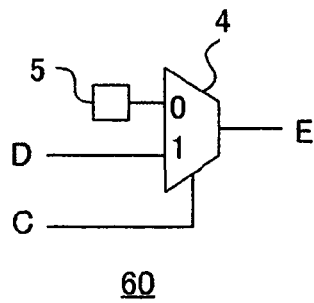
60
Fig. 15
| MEMORY | LOGIC FUNCTION |
|--------|----------------|
| 0 | D, C AND → E |
| 1 | D, C̄ OR → E |
Fig. 16
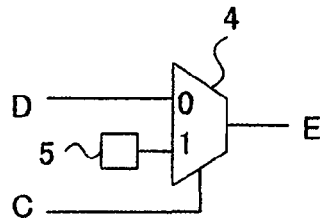
60
Fig. 17
| MEMORY | LOGIC FUNCTION |
|--------|----------------|
| 0 | D, C̄ NAND → E |
| 1 | D, C OR → E |

US 8,390,321 B2

RECONFIGURABLE LOGICAL CIRCUIT

TECHNICAL FIELD

The present invention relates to a reconfigurable logic circuit.

BACKGROUND ART

A reconfigurable logic circuit (reconfigurable array) is composed by arranging programmable cells in an array. Then, each programmable cell includes a logic block for performing various operations, and a programmable routing resource that programmably connects an input and an output of the logic block according to configuration data.

FIG. 19 shows a logic block 200 of a reconfigurable logic circuit disclosed in PTL 1. The logic block disclosed in PTL 1 is a configuration in which outputs 221A and 221B of preposition logics 220A and 220B are respectively connected to argument inputs A and B of a full adder 230. In the full adder 230, CI is a carry input (231), CO is a carry output (232), and S is a summing output (233).

The preposition logic 220 (preposition logics 220A and 220B are collectively referred to as the preposition logic 220.) inputs inputs 210A and 210B of the preposition logic. The preposition logic 220 is a block which can perform various logical operations. In the case of a relatively small-scale logical operation with not many numbers of inputs, by combining the functions of the two preposition logics 220A and 220B, and the full adder 230, a logical circuit can be realized by one logic block 200.

On the other hand, in the case of a large-scale logic operation with the number of inputs of a certain extent or more, it is difficult to realize the logic circuit by one logic block. In this case, a logic circuit in which a plurality of logic blocks 200_i are connected as shown in FIG. 20 is used. In the logic circuit shown in FIG. 20, a carry output CO and a carry input CI of the plurality of logic blocks 200_i (i is an integer) are connected in cascade, and a ripple carry is composed. Then, a multi-bit full adder is formed.

In FIG. 20, one preposition logic 220B of each logic block 200_i (i is an integer) is configured to output a fixed logic value 0 or 1. For example, when configuring in a way that the fixed logic value as shown in FIG. 21 is provided to the argument input B of each full adder 230, FIGS. 21 and 22 will be equivalent circuit. The reason is that when the fixed logic value 0 is provided to one input of the full adder 230, the carry output CO outputs a logical AND of the remaining two inputs, while when the fixed logic value 1 is provided to one input of the full adder 230, the carry output CO outputs a logical OR of the remaining two inputs. In this way, it is possible to compose the circuit as shown in FIG. 22 in which the plurality of preposition logics 220 are connected in cascade by the logical AND and the logical OR.

CITATION LIST

Patent Literature

PTL 1: Japanese Patent No. 3185727

SUMMARY OF INVENTION

Technical Problem

However, in a logic circuit configuration using the ripple carry explained in the related art, only one of the two preposition logics 220A and 220B is effectively used. The reason is that one of the two preposition logics 220A and 220B must be used for generating the fixed logic value. For example, in a circuit shown in FIG. 21, since the preposition logic 220B is used as a generation circuit of the fixed logic value, only the preposition logic 220A among the two preposition logics can be used for operations.

Accordingly, a purpose of the present invention is to effectively use the preposition logic that composes the logic block.

Solution to Problem

A reconfigurable logic circuit according to the present invention includes a plurality of logic blocks that have a full adder, two preposition logics for performing a plurality of logic operations according to configuration data, and an extended logic block that can perform the logic operation of one or more kinds, in which outputs of the two preposition logics are respectively connected to two argument inputs of the full adder, and a carry output of the full adder is connected to the extended logic block, one selected from a plurality of signals including a fixed logic value according to the configuration data is input to a carry input of the full adder, and an extended logic block of a subsequent logic block generates an output signal according to an output of the extended logic block.

Advantageous Effects of Invention

By the reconfigurable logic circuit according to the present invention, it is possible to effectively use the preposition logic that composes the logic block.

BRIEF DESCRIPTION OF DRAWINGS

FIG. 7 is a table of correspondence between inputs of the preposition logic and logic functions;

FIG. 14 is a view showing another configuration example of the extended logic block;

FIG. 15 is a table of correspondence between inputs of the extended logic block shown in FIG. 14 and logic functions;

FIG. 16 is a view showing another configuration example of the extended logic block;

FIG. 17 is a table of correspondence between inputs of the extended logic block shown in FIG. 16 and logic functions;

DESCRIPTION OF EMBODIMENTS

First Exemplary Embodiment

Hereinafter, exemplary embodiments of the present invention are explained with reference to the drawings.

Figure 1:
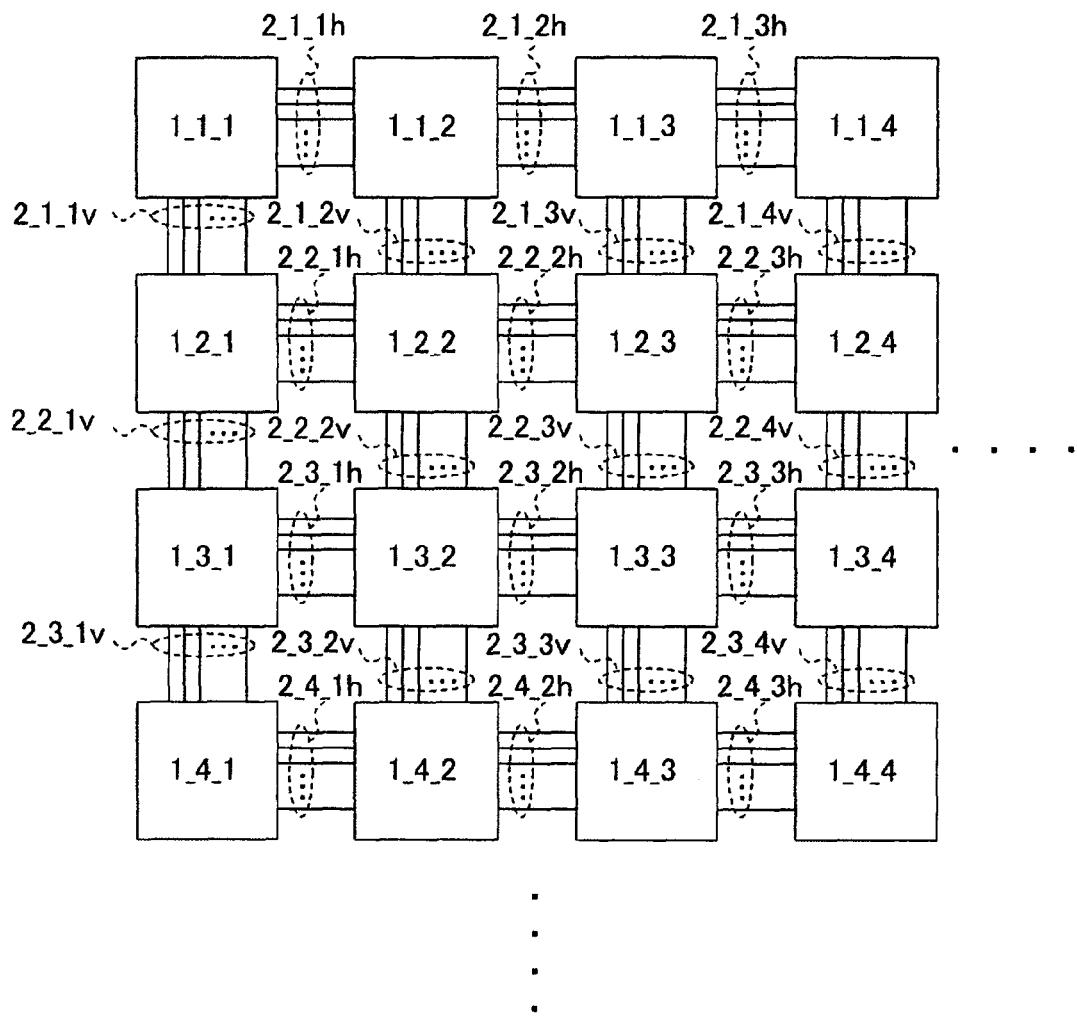
FIG. 1 is a view showing a reconfigurable logic circuit according to a first exemplary embodiment.

FIG. 1 is a view showing a reconfigurable logic circuit (also referred to as a reconfigurable array) according to this exemplary embodiment. $1\_i\_j$ is a programmable cell and i and j are the integers indicating coordinates of the position of a cell. The size of an array may be arbitrary. Further, each programmable cell is connected by a horizontal wire $2\_i\_jh$ and a vertical wire $2\_i\_jv$.

Figure 2:
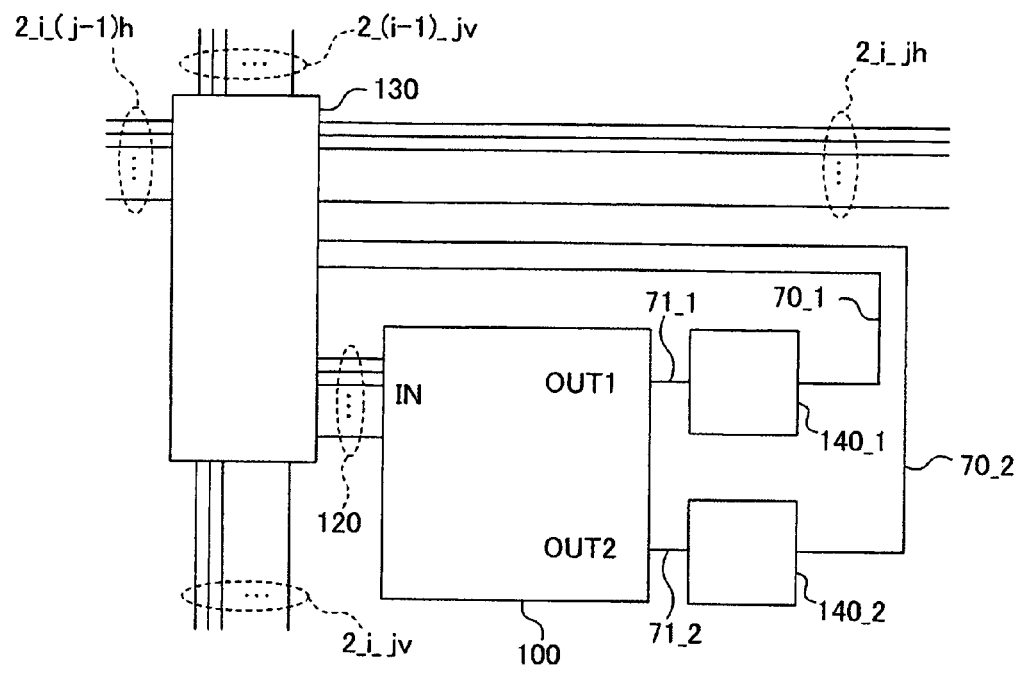
FIG. 2 is a view showing a programmable cell that composes the reconfigurable logic circuit according to the first exemplary embodiment.

FIG. 2 is a view showing a programmable cell that composes the reconfigurable logic circuit according to this exemplary embodiment. A programmable cell 1 includes a logic block 100 that performs various operations, register blocks 140_1 and 140_2 connected to each of outputs OUT1 and OUT2, and a programmable switch block 130. The programmable switch block 130 programmably connects between outputs 70_1 and 70_2 of each register block 140_1 and 140_2, and between an input 120 of the logic block 100 and wires $2\_i\_jh$, $2\_i\_(j-1)h$, $2\_i\_jv$, and $2\_(i-1)\_jv$(s).

Figure 3:
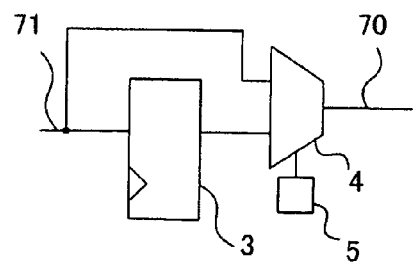
FIG. 3 is a view showing a register block that composes the programmable cell according to the first exemplary embodiment.

The register block 140 (register blocks 140A and 140B are collectively referred to as the register block 140) is a configuration including, as shown in FIG. 3, a multiplexer 4 in which an output 70 is selected according to the configuration memory 5, and a register 3. The register block 140 can select an input 71 of the register block 140 or the input 71 via the register 3 as an output 70 according to configuration data held to the configuration memory 5.

Figure 4:
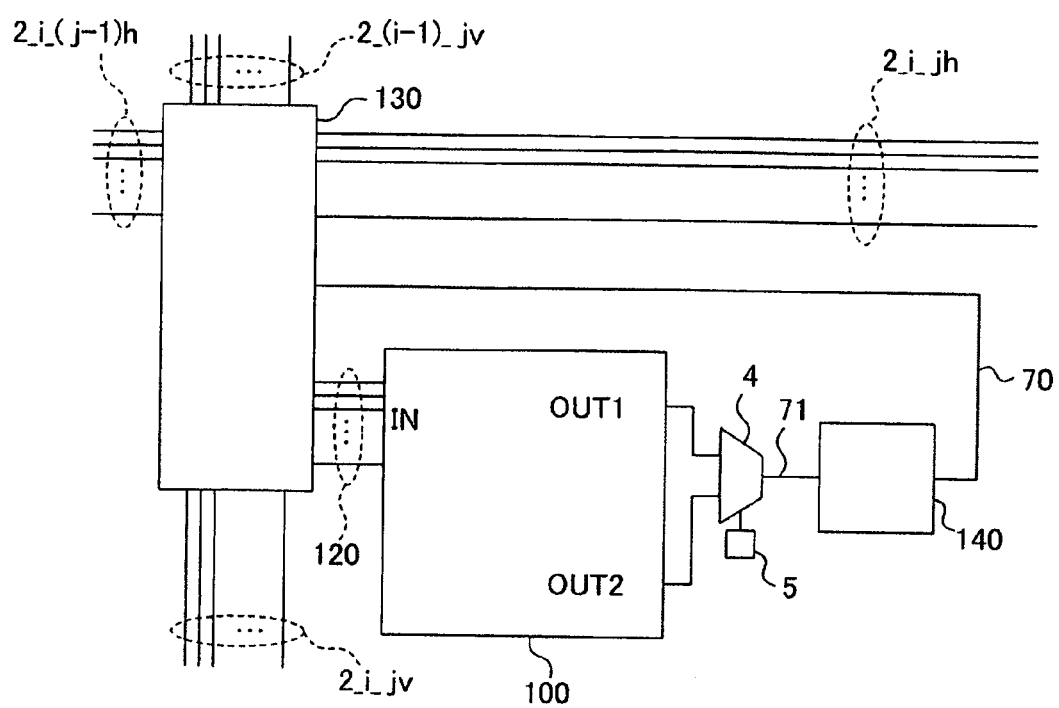
FIG. 4 is a view showing another configuration example of a programmable cell that composes the reconfigurable logic circuit according to the first exemplary embodiment.

FIG. 4 is a view showing another configuration example of a programmable cell that composes the reconfigurable logic circuit according to this exemplary embodiment. Unlike the example shown in FIG. 2, one of the two outputs OUT1 and OUT2 of the logic block 100 is selected by the multiplexer 4, and the selected signal 71 is made to be the input 71 of the register block 140. The selection of either the OUT1 or OUT2 is determined by content of the configuration memory 5.

Figure 5:
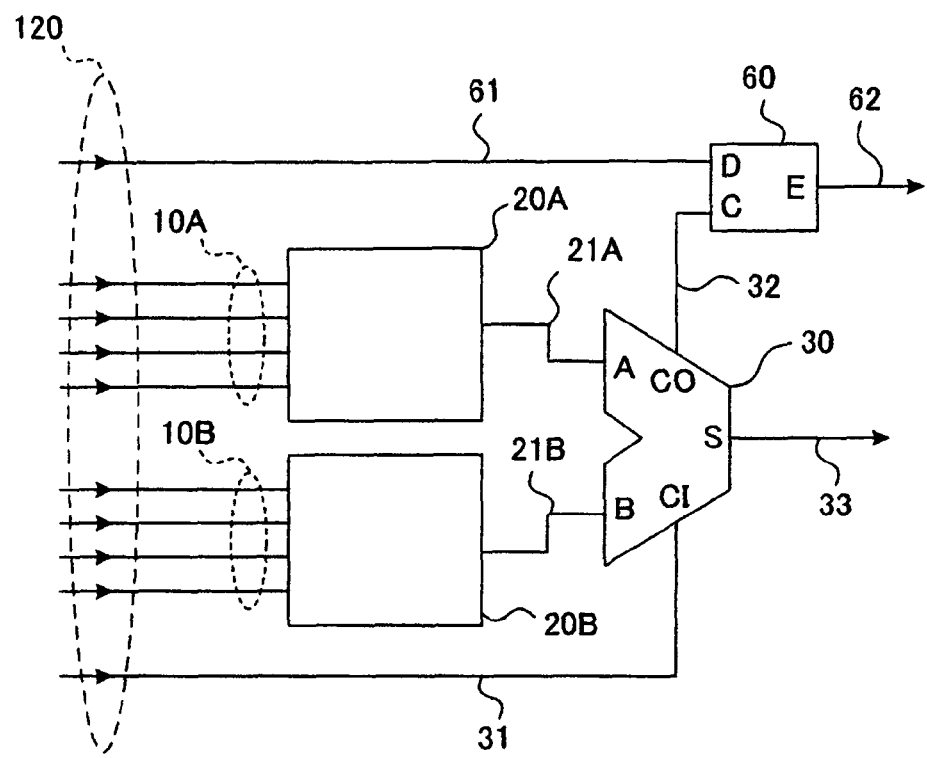
FIG. 5 is a view showing a logic block that composes the programmable cell according to the first exemplary embodiment.

FIG. 5 is a view showing a logic block that composes the programmable cell according to this exemplary embodiment. The logic block 100 includes a full adder 30, two preposition logics 20A and 20B, and an extended logic block 60. Outputs 21A and 21B of the preposition logics 20A and 20B are respectively connected to argument inputs A and B of the full adder 30, and a carry output 32 of the full adder 30 is connected to one input C of the extended logic block 60.

An output 62 of the extended logic block 60 and an output 33 of the full adder 30 correspond to the outputs OUT1 and OUT2 of the logic block 100 in FIG. 2 or 4. An input 61 of the extended logic block 60, inputs 10A and 10B of the preposition logics 20A and 20B, and a carry input 31 of the full adder 30 correspond to an input IN (120) of the logic block 100 in FIG. 2 or 4.

Figure 6:
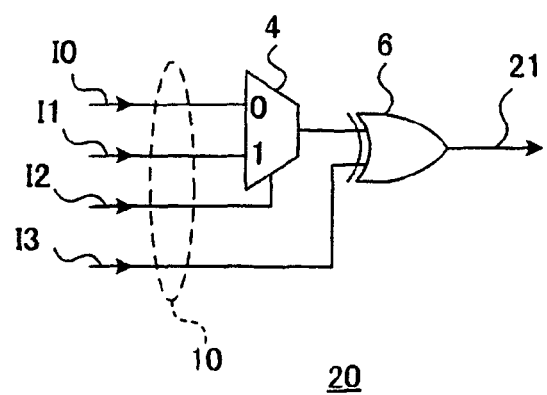
FIG. 6 a view showing a preposition block that composes the logic block according to the first exemplary embodiment.

FIG. 6 is a view showing the prepositional block that composes the logic block according to this exemplary embodiment. This preposition logic 20 (the preposition logics 20A and 20B are collectively referred to as the preposition logic 20) is made by connecting an exclusive logic gate 6 to the output of the multiplexer 4, and by changing the signal provided to the input 10, various logic operations can be performed.

FIG. 7 is a table indicating input signals input to each input terminals I0, I1, I2, and I3 of the preposition logic, and logic functions corresponding to the input signals. In each row, 0 means that the fixed logic value 0 is provided to the terminal, and 1 means that the fixed logic value 1 is provided to the terminal. x means that the terminal does not influence (don't care) the logic block. The ones with input terminal names mean that the input terminal will be an input of the logic function as it is. In the table shown in FIG. 7, all the two-input logic functions are included. Thus, the preposition logic 20 shown in FIG. 6 can perform various logical operations by the input signals input to each input terminal I0, I1, I2, and I3.

Figures 8, 9:
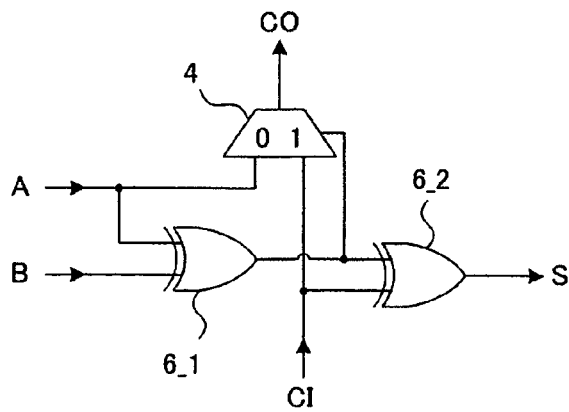
FIG. 8 is a view showing a full adder that composes the logic block according to the first exemplary embodiment.
FIG. 9 is a table of correspondence between inputs of the full adder and logic functions.

FIG. 8 is a view showing the full adder 30 that composes the logic block according to this exemplary embodiment. Further, FIG. 9 is a table of correspondence between inputs (A, B, and CI) of the full adder shown in FIG. 8 and the logic functions. As shown in the table of FIG. 9, when the fixed logic value 0 is provided to one of the input terminals A, B, and CI, a logical AND and an exclusive OR of the remaining inputs are respectively output to the carry output CO and a summing output S. Moreover, when the fixed logic value 1 is provided to one of the input terminals A, B, and CI, a logical OR and XNOR of the remaining inputs are respectively output to the carry output CO and the summing output S. As described above, the full adder 30 can perform various logical operations according to the input signal provided to the input terminals A, B, and CI.

Accordingly, since the preposition logic 20 and the full adder 30 can perform various logical operations, various logic operation results combining them can be output to the outputs 32 and 33 of the logic block 100 of FIG. 5. At this time, in order for the preposition logic 20 and the full adder 30 to perform various logic operations, the switch block 130 shown in FIG. 2 or 4 provides the fixed logic value 0 or 1 to each wire of the inputs 10A, 10B, and 31 or provides a signal on one of other wires. Such method to provide the input signal is configured by the configuration data that is held to the configuration memory included in the switch block 130.

Further, the preposition logic 20 shown in FIG. 5 may be any kind of circuit as long as the circuit can program a plurality of logic operations. For example, a look-up table may be used as the preposition logic 20. The look-up table of N input includes Nth power of two of the configuration memories and can realize the logic operation of any N input.

Moreover, although FIG. 5 shows the example of the preposition logic 20 including four input terminals, the number of inputs of the preposition logic may be arbitrate. Further, the two preposition logics included in the logic block 100 may have different configuration from each other, and may have different number of inputs.

Figure 10:
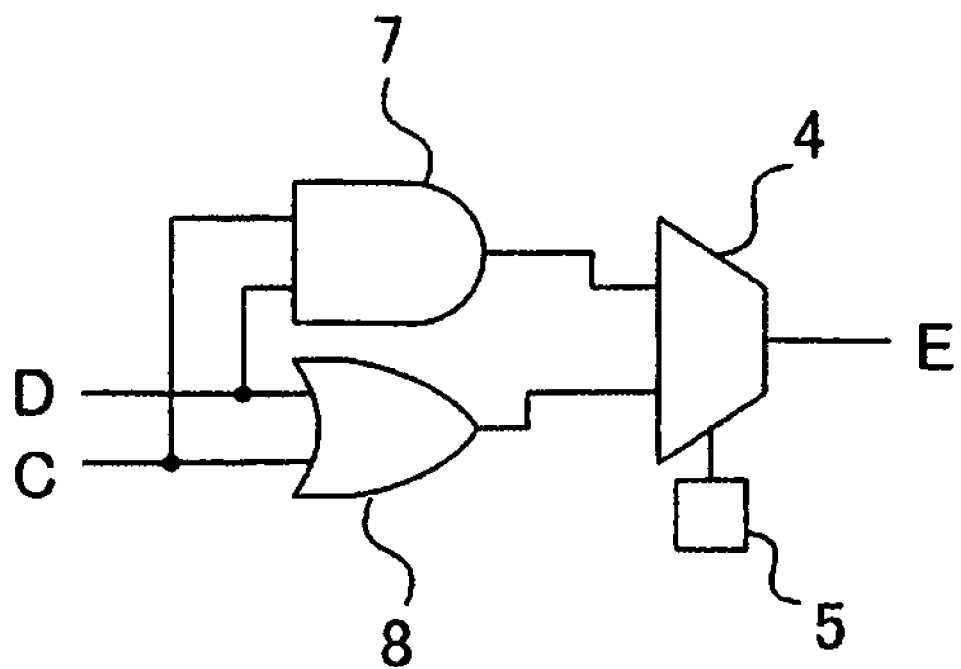
FIG. 10 is a view showing an extended logic block that composes the logic block according to the first exemplary embodiment.

FIG. 10 is a view showing the extended logic block that composes the logic block according to this exemplary embodiment. The extended logic block 60 selects either a logical AND 7 or a logical OR 8 of the inputs D and C according to the content of the configuration memory 5 by the multiplexer 4, and outputs it to E. As shown in FIG. 5, since one input C of the extended logic block 60 is connected to the carry output 32, a logical AND and a logical OR of the signal and the input 61 from other logic block are generated to be the output 62.

Figure 11:
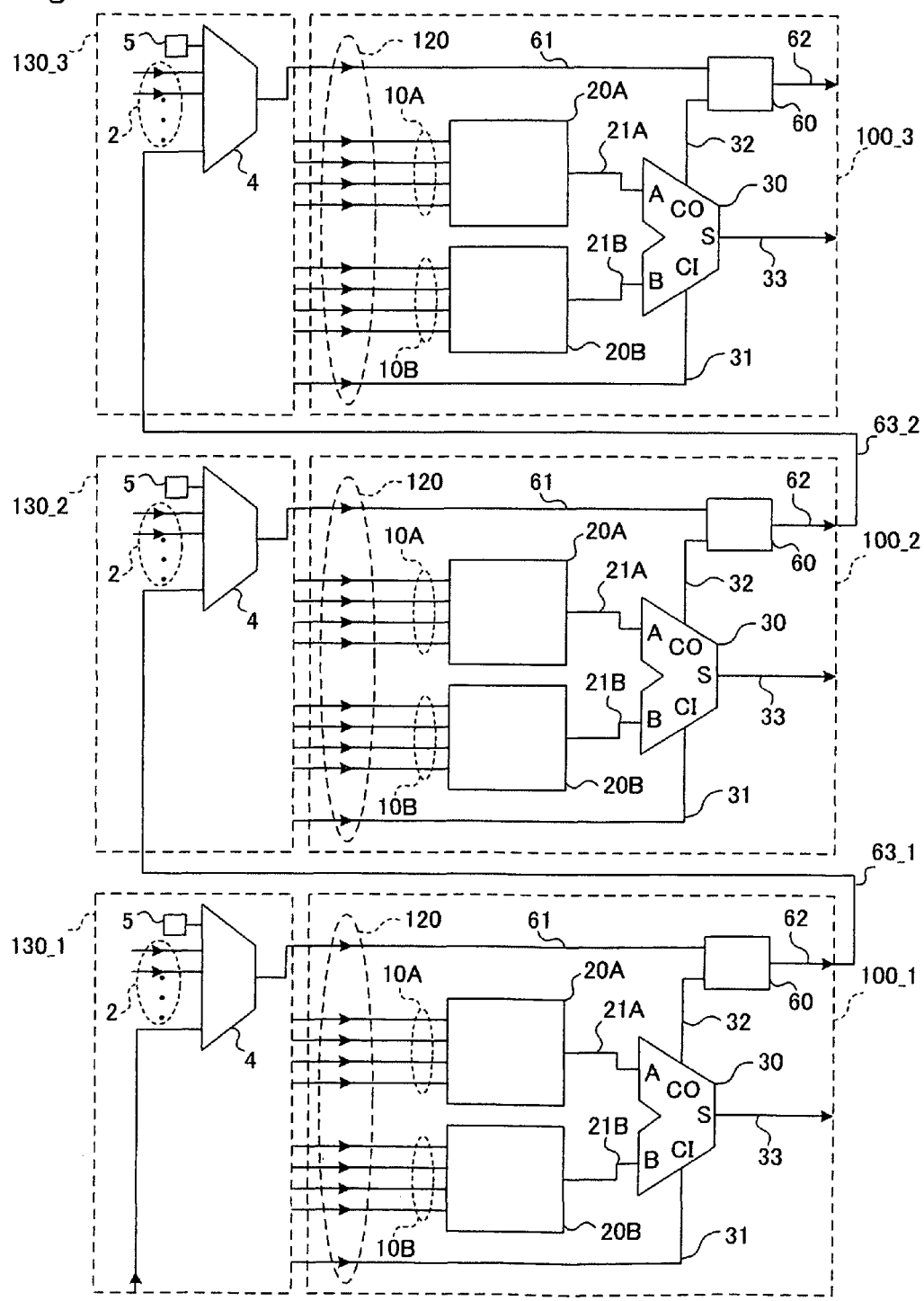
FIG. 11 is a view showing a case of coupling a plurality of logic blocks.

FIG. 11 is a view showing a case of coupling a plurality of logic blocks. The output 62 of the extended logic block of the logic block 100_i (i is an integer) is transmitted to the switch block 130_(i+1) associated with the logic block 100_(i+1) by a wire 63_i. Further, it is connected to the input 61 of the extended logic block 60 of the logic block 100_(i+1) via the multiplexer 4 included in the logic block 100_(i+1).

The multiplexer 4 programmably selects one of the wire 63_i, a wiring group 2, and the configuration memory 5 from the logic block of the previous stage, and outputs it to the extended logic block 60. Here, the configuration memory 5 is used for the case of generating the fixed logic value 0 or 1. Furthermore, the selection by the multiplexer 4 between one of the signals is determined by the content of another configuration memory (not shown in the drawings). Moreover, the wire 63_i may be via some switch blocks 130_i.

Figure 12:
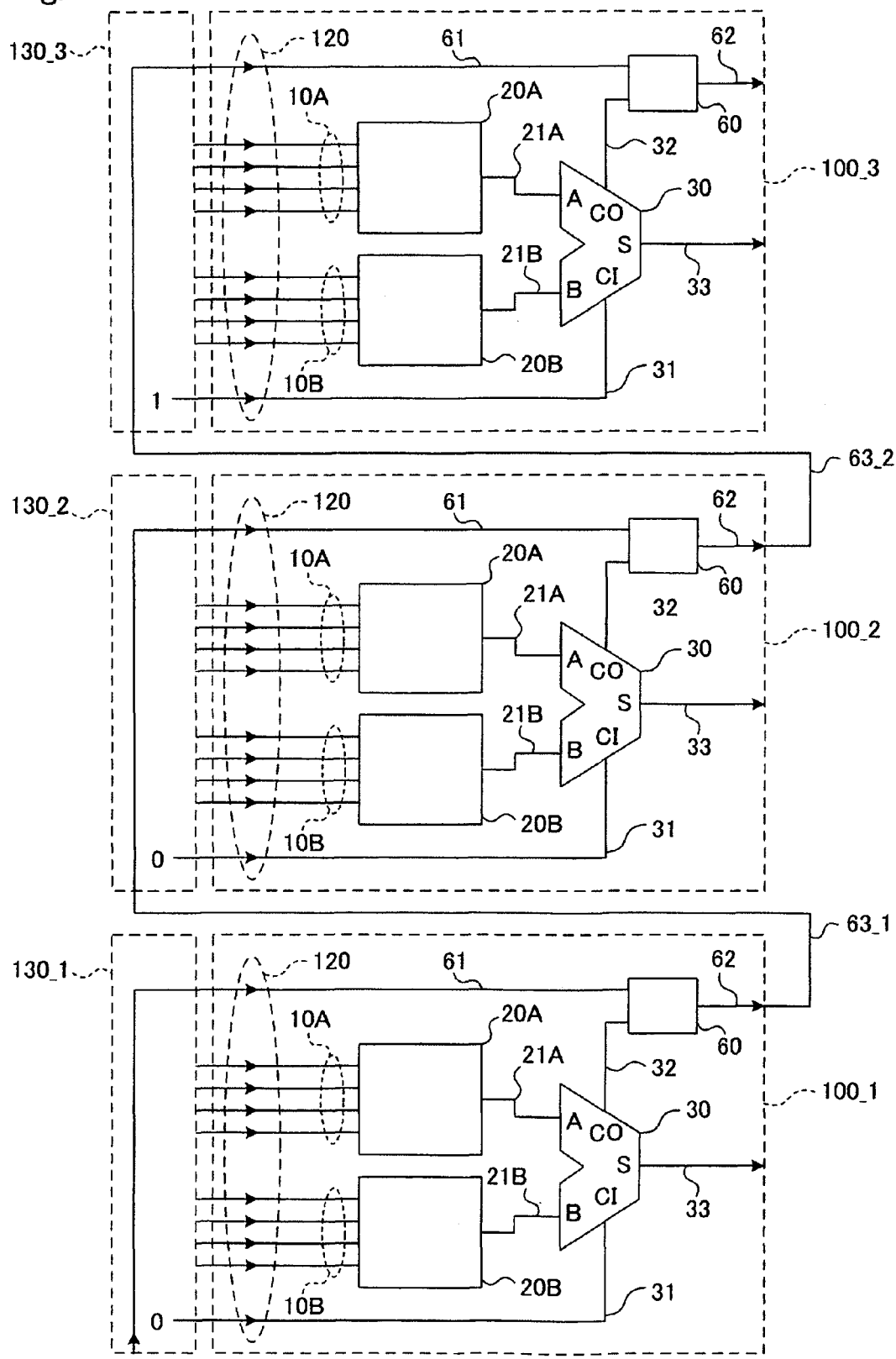
FIG. 12 is a view showing an example of realizing a multiple-input logic operation in the circuit shown in FIG. 11.

FIG. 12 is a view showing an example of realizing a multi-input logic operation in the circuit shown in FIG. 11. In the circuit shown in FIG. 12, each multiplexer 4 is configured to select a signal of the wire 63_i in the circuit shown in FIG. 11. Further, it is configured that the fixed logic value 0 or 1 is provided to the carrier input 31. That is, the fixed logic value 0 is input to the carry input 31 of the logic blocks 100_1 and 100_2, and the fixed logic value 1 is input to the carry input 31 of the logic block 100_3.

As shown in the table of FIG. 9, when the fixed logic value 0 is input to the carry input (CI) 31 of the full adder 30, a logical AND of the argument inputs A and B is input to the carry input (CO) 32. Moreover, when the fixed logic value 1 is input to the carry input (CI) 31 of the full adder 30, a logical OR of the argument inputs A and B is output to the carry output (CO) 32. Accordingly, the circuit shown in FIG. 12 will be an equivalent circuit to the circuit shown in FIG. 13.

Therefore, it is possible to obtain a circuit in which a logical OR or a logical AND of the outputs 21A and 21B of the two preposition logics 20A and 20B of each logic block 100_1 to 100_3 are coupled via the extended logic block 60. In the example shown in FIG. 13, the output 62 of the extended logic block 60 of the top logic block 100_3 will be a logical operation result of all the circuits. When using the example shown in FIG. 10, the extended logic block 60 can program as a logical AND or a logical OR, thus the circuit of FIG. 13 can realize a multiple-input large-scale logic operation.

Figure 20:
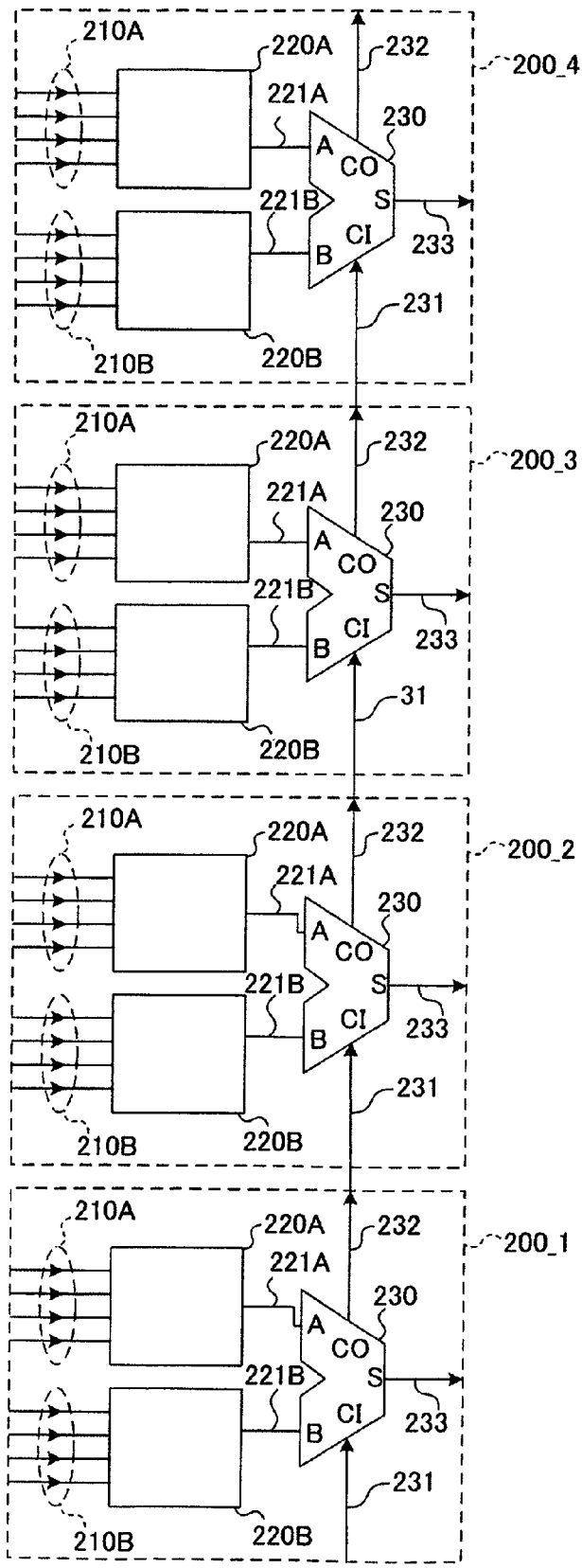
FIG. 20 is a view in which a plurality of logic blocks are connected in cascade by carry according to the related art.
Figure 21:
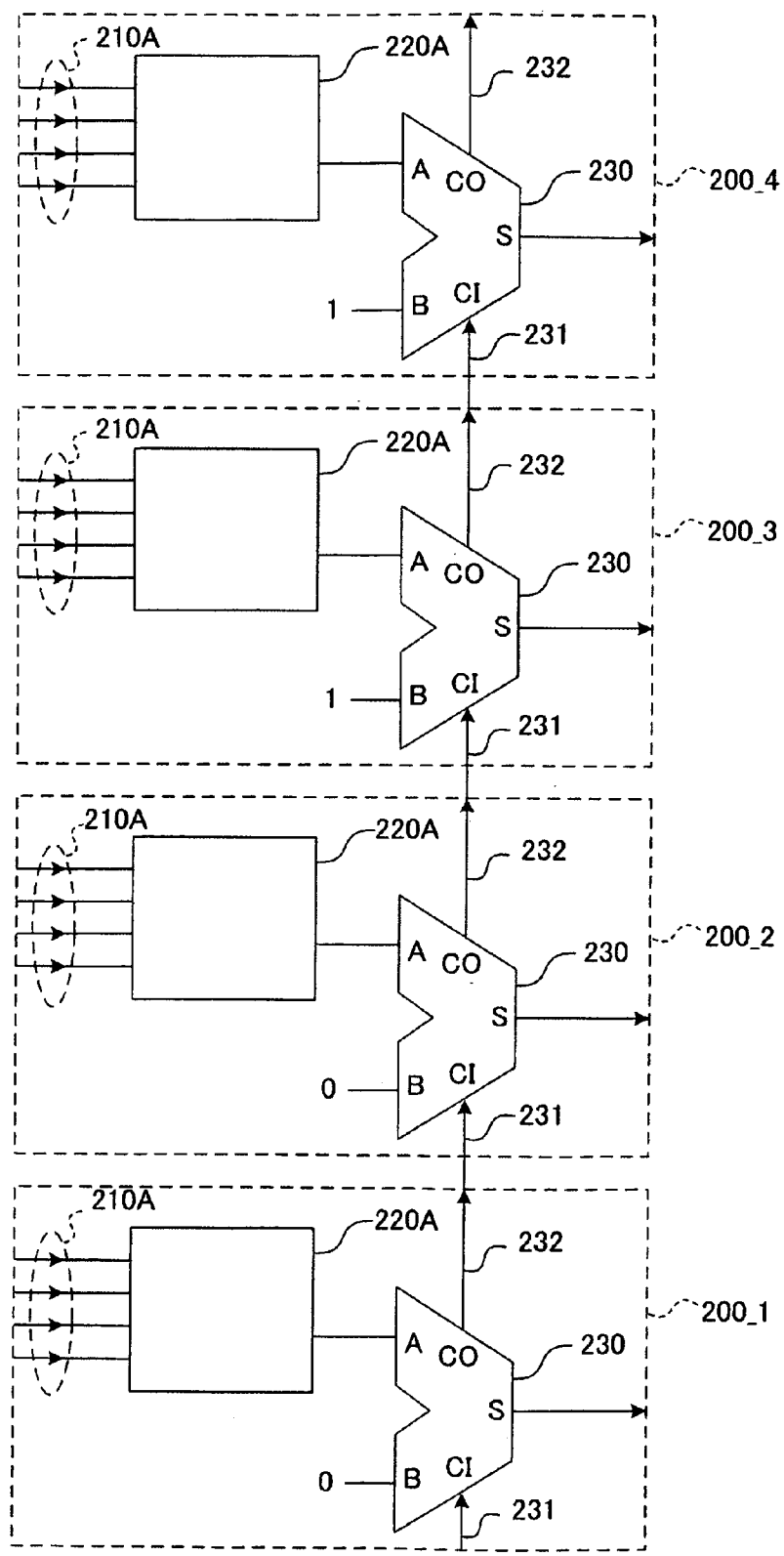
FIG. 21 is a view showing an example of realizing a multiple-input logic operation in the circuit shown in FIG. 20.
Figure 22:
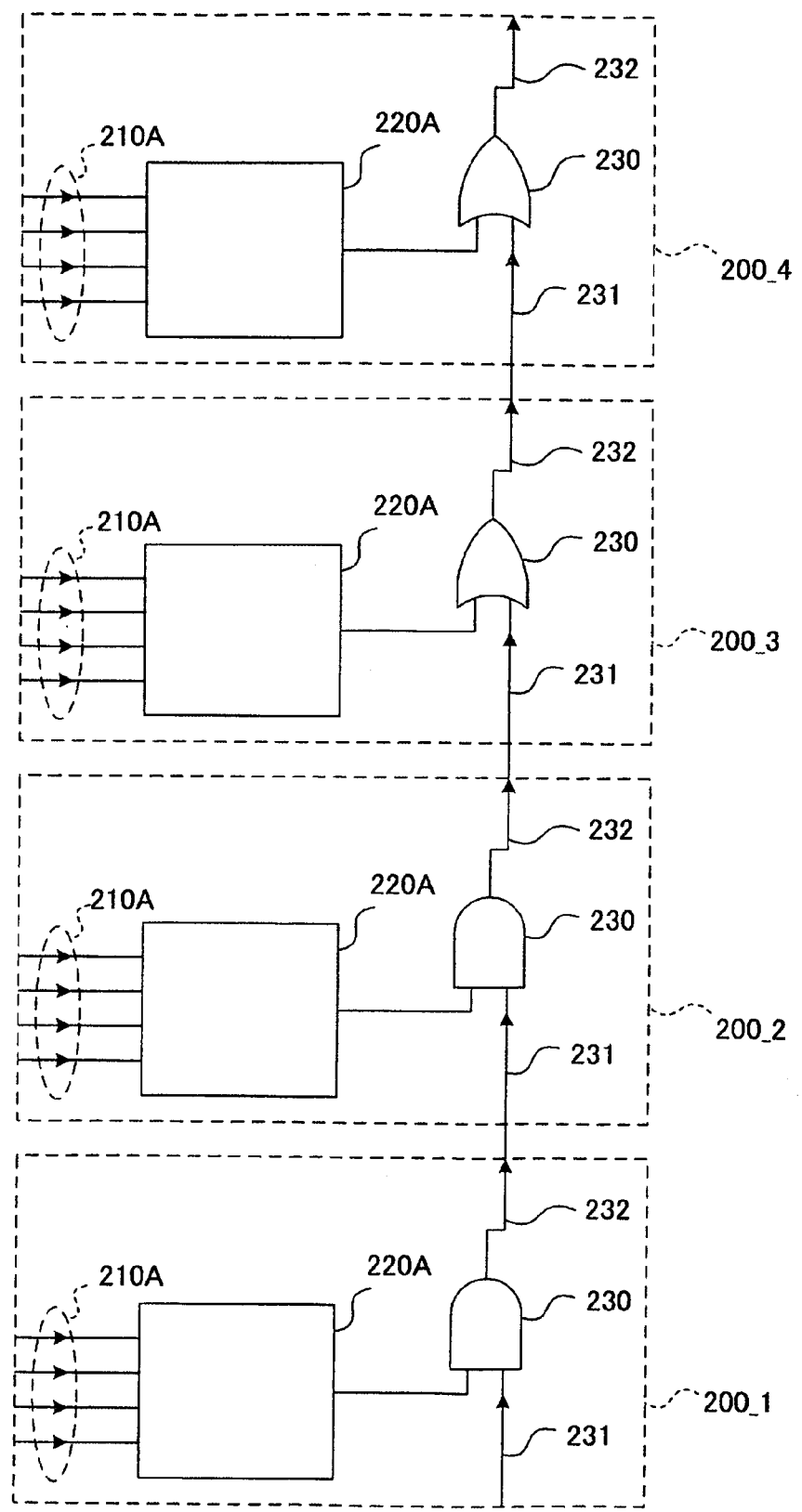
FIG. 22 is a view showing an equivalent circuit of the circuit shown in FIG. 21.

Accordingly, in the logic block coupling method using the ripple carry according to the related art as shown in FIG. 20, one of the two preposition logics 220A and 220B of each logic block 200 is used for fixed logic value generation, thus only the remaining one preposition logic can be used for the logic operation (see FIG. 21). However, in the logic circuit according to this exemplary embodiment, by providing the extended logic clock 60, both of the two preposition logics 20A and 20B included in each logic block 100 can be used for logical operations. Accordingly, an equivalent logic operation can be realized by half the number of logic blocks, that is, the number of program cells, as compared to the logic circuit according to the related art.

Moreover, the extended logic block 60 has a simple configuration and an extremely small circuit area as compared to other parts of the programmable cell 1. Therefore, an increase in the circuit area of the programmable cell 1 by the addition of the extended logic block 60 is negligible. As described so far, by using the exemplary embodiment of the present invention, it is possible to realize the same logic operation by nearly half of the area as compared to the logic circuit according to the related art.

Figure 13:
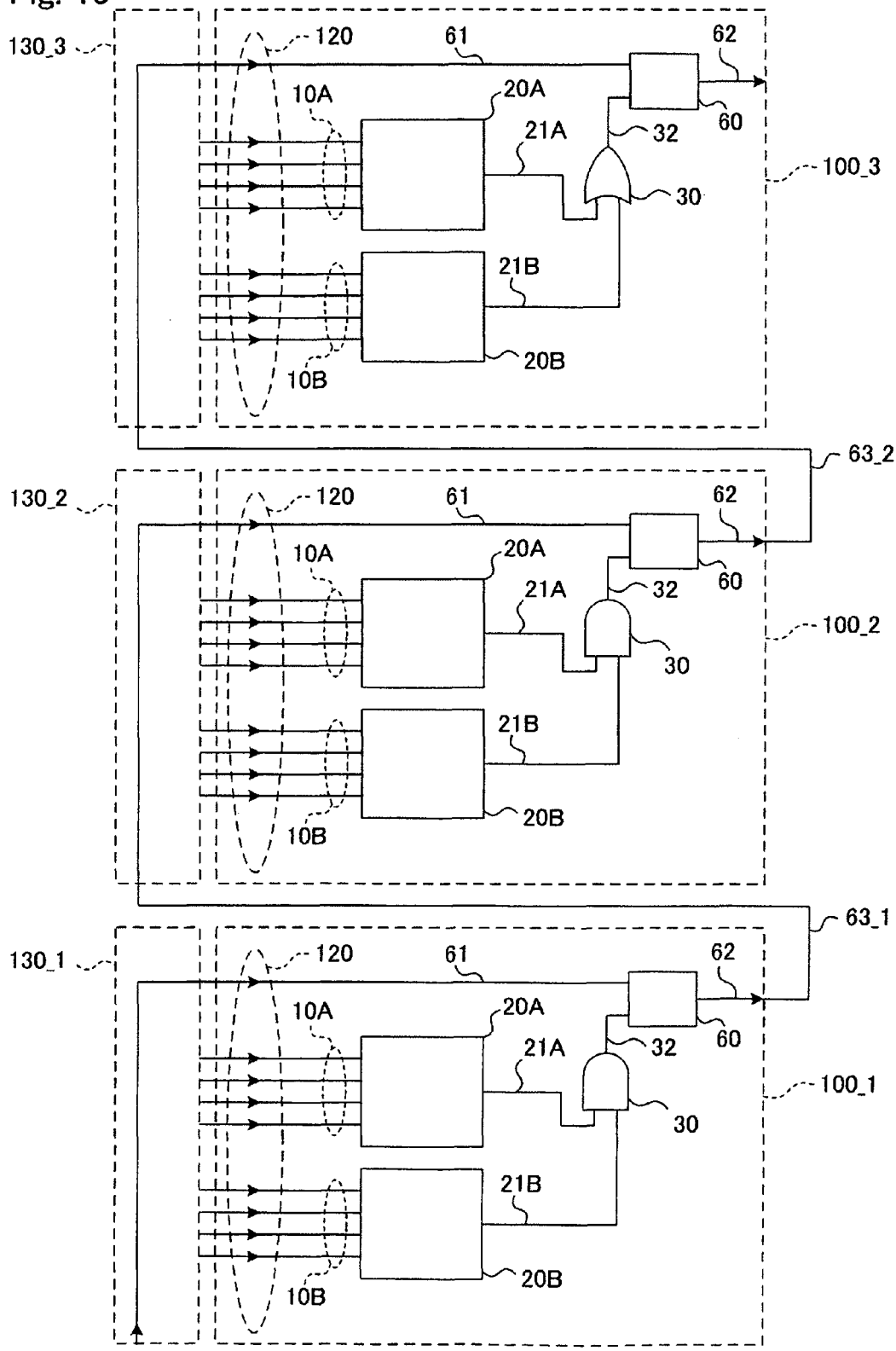
FIG. 13 is a view showing an equivalent circuit of the circuit shown in FIG. 12.

Note that in the reconfigurable logic circuits shown in FIGS. 11, 12 and 13, an example of connecting three logic blocks 100_1 to 100_3 is shown, the number of logic blocks to couple may be any number as long as it is greater than or equal to two.

FIG. 14 is a view showing another configuration example of the extended logic block 60. In the extended logic block 60 shown in FIG. 14, the configuration memory 5 is connected to a zero side input (input selected when a signal 0 is provided to the control terminal C) of the multiplexer 4. In the extended logic block 60 shown in FIG. 14, as shown in FIG. 15, the logical operation according to the output value of the configuration memory 5 can be performed.

Although FIG. 15 includes the logical OR in which a C terminal is logically inverted, a logical OR with no logical inversion is not included. However, the output of an operational unit connected to the C terminal can often generate both of the output with logical inversion and the output with no logical inversion. In that case, the extended logic block 60 of FIG. 14 can also realize the logical OR which does not substantially include the logic inversion.

In the logic block 100 of FIG. 5, when using the example of the preposition logic, which is already explained, the output 32 to the C terminal of the extended logic block 60 can generate both of the output with logic inversion and the output with no logic inversion.

FIG. 16 is a view showing another configuration example of the extended logic block 60. In the extended logic block 60 shown in FIG. 16, the configuration memory 5 is connected to a one side input (input selected when a signal 1 is provided to the control terminal C) of the multiplexer 4. In the extended logic block 60 shown in FIG. 16, as shown in FIG. 17, the logical operation according to the output value of the configuration memory 5 can be performed. Further, by the same reason as the case of the extended logic block of FIG. 14, the example of this extended logic block 60 can also be substantially used as a logical AND and a logical OR.

The extended logic block 60 shown in FIGS. 14 and 16 substantially has equivalent functions as the extended logic block shown in FIG. 10, and moreover it can be composed by fewer components than the extended logic block shown in FIG. 10. Therefore, the area of the circuit can be reduced, and the processing speed can be further faster.

Moreover, the look-up table of two inputs may be used as the extended logic block 60. In this case, although the area and the operation speed are inferior as compared to the above-mentioned example, there is an exemplary advantage that there are more logic functions that can be realized.

Additionally, although FIG. 5 shows the example of the simplest extended logic block 60 of two inputs, the number of inputs of the extended logic block 60 may be more than two.

As explained above, by the reconfigurable logic circuit using the logic block according to this exemplary embodiment, it is possible to realize the equivalent logic function by a smaller area than the circuit according to the related art. The reason is that by coupling the logic blocks by the extended logic block, two preposition logics in the logic block can be used for the logic operation.

That is, in the method according to the related art in which the logic blocks are connected by carry chain, only one preposition logic can be used for the logic operation, however two preposition logics can be used for the logic operation by the logic circuit according to this exemplary embodiment. Accordingly, it is possible to realize the same logic function by half the number of logic blocks as compared to the logic circuit according to the related art.

Second Exemplary Embodiment

Next, a second exemplary embodiment of the present invention is explained. In the reconfigurable logic circuit according to this exemplary embodiment, the carry output of the full adder is connected to the carry input of other full adder not via the extended logic block. Since others are similar to the reconfigurable logic circuit according to the first exemplary embodiment, duplicated explanation is omitted.

In FIG. 5, when programming the extended logic block 60 as a logical AND and the fixed logic value 1 is provided to the input 61, the extended logic block 60 can output the carry output 32 of the full adder 30 to the output 62 as it is. By connecting the output 62 to the carry input 31 of the adjacent logic block 100, a ripple carry can be formed. By connecting many logic blocks by such method, a multi-bit adder can be realized. However, in this method, as the carry signal must pass through the extended logical bock 60, there is a problem that the propagation delay of the carry signal will be large. The circuit configuration of the reconfigurable logic circuit according to this exemplary embodiment to avoid this problem is shown in FIG. 18.

Figure 18:
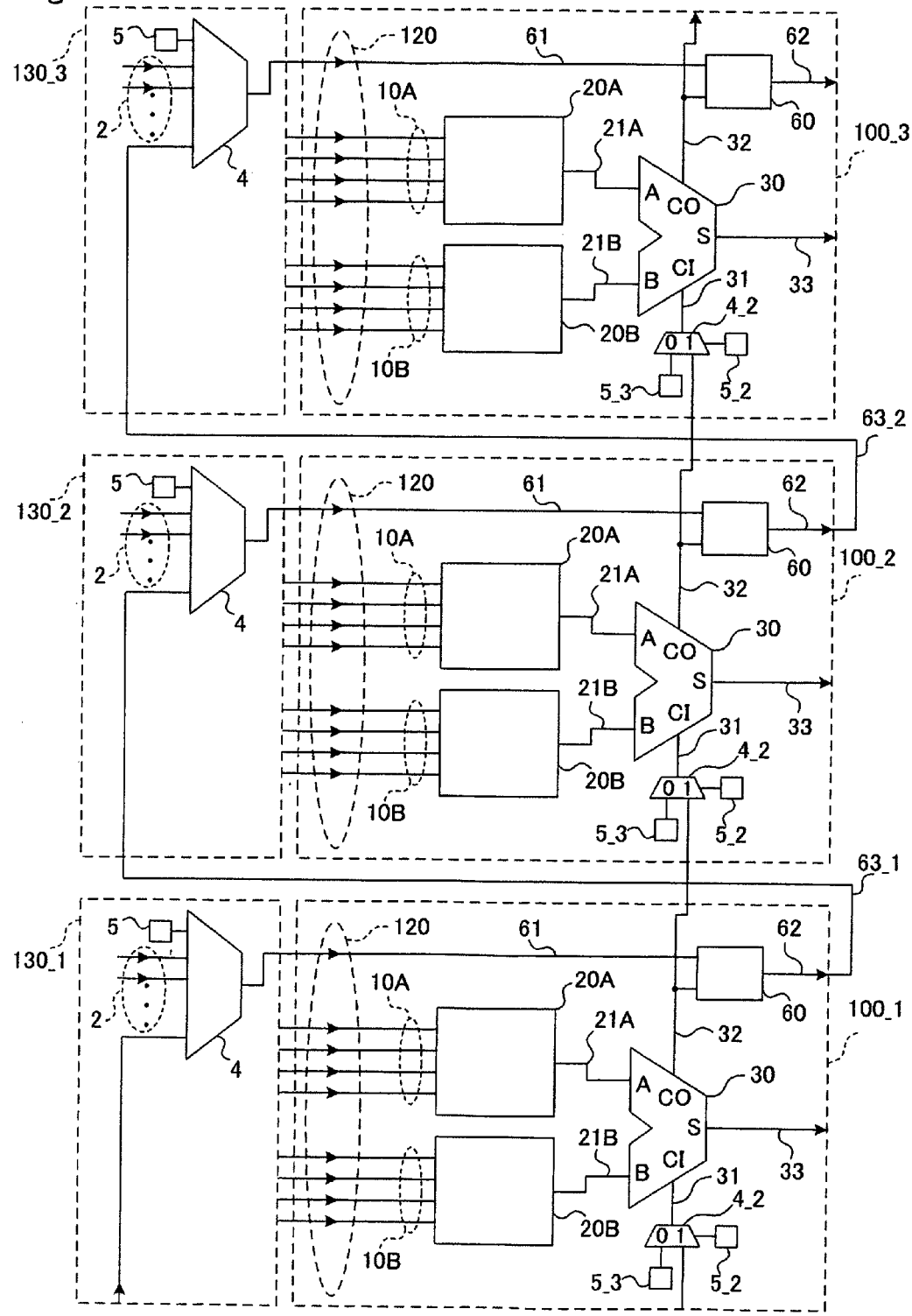
FIG. 18 is a view showing a logic block that composes a programmable cell according to a second exemplary embodiment, and shows an example of a logic block sequence provided with a carry propagation path not via the extended logic block.
Figure 19:
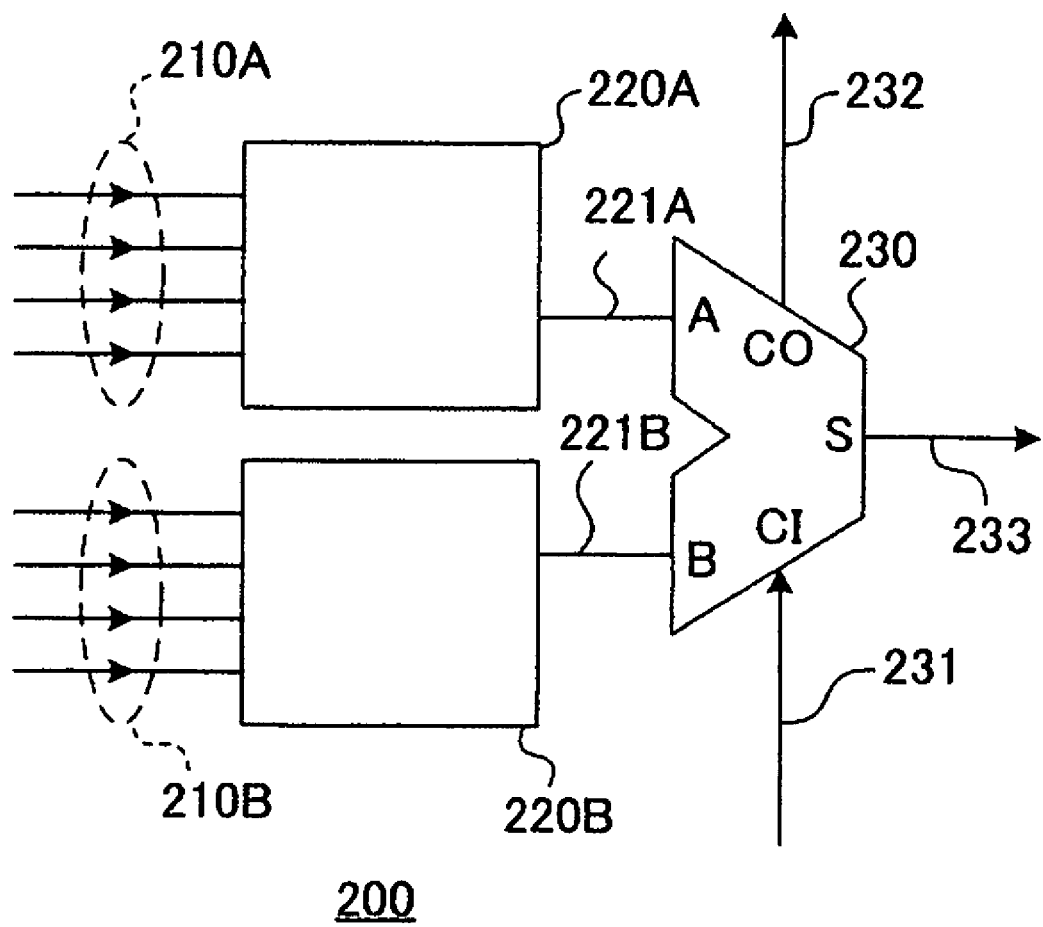
FIG. 19 is a view showing a logic block that composes a reconfigurable logic circuit according to a related art.

FIG. 18 shows an example of providing a means to connect the carry output 32 of the logic block 100_$i$ to the carry input 31 of the logic block 100_($i$+1) not via the extended logic block 60 ($i$ is an integer). The multiplexer 4_2 inside each logic block 100 transmits the carry output 32 of other logic block to the carry input 31 or transmits the fixed logic value from the configuration memory 5_3 according to the content of the configuration memory 5_2.

As the carry output 32 of the logic block 100 is connected to the multiplexer 4_2 of other logic block not via the extended logic block 60, high-speed carry signal propagation can be realized. Note that although FIG. 18 explained the multiplexer 4_2 including two inputs as an example, the input to the multiplexer 4_2 may be more and another signal may be added as the input signal.

Although the present invention has been explained along with the above exemplary embodiments, it is not limited to the configurations of above exemplary embodiments, and it is needless to mention that various modifications, corrections, and combinations that can be made by the person in the art are included within the scope of the invention of the claims in the scope of the present invention claims.

The present application claims priority rights of and is based on Japanese Patent Application No. 2009-065741 filed on Mar. 18, 2009 in the Japanese Patent Office, the entire contents of which are hereby incorporated by reference.

INDUSTRIAL APPLICABILITY

The present invention can be applied to a reconfigurable logic circuit.

REFERENCE SIGNS LIST 1 and 1_$i$_$j$ PROGRAMMABLE CELL
2_$i$_$jh$ HORIZONTAL WIRE
2_$i$_$jv$ VERTICAL WIRE
3 REGISTER
4 and 4_$i$ MULTIPLEXER
5 and 5_$i$ CONFIGURATION MEMORY
6 and 6_$i$ EXCLUSIVE OR
7 LOGICAL AND
8 LOGICAL OR
10, 10A, and 10B INPUT OF PREPOSITION LOGIC
20, 20A, and 20B PREPOSITION LOGIC
21, 21A, and 21B OUTPUT OF PREPOSITION LOGIC
30 FULL ADDER
31 CARRY INPUT OF FULL ADDER
32 CARRY OUTPUT OF FULL ADDER
33 SUMMING OUTPUT OF FULL ADDER
60 EXTENDED LOGICAL BLOCK
61 INPUT OF EXTENDED LOGICAL BLOCK
62 OUTPUT OF EXTENDED LOGICAL BLOCK
63_$i$ WIRE TO CONNECT OUTPUT OF EXTENDED LOGICAL BLOCK TO OTHER LOGIC BLOCK
100 and 100_$i$ LOGIC BLOCK
120 and INPUT OF LOGIC BLOCK
130 and 130_$i$ SWITCH BLOCK
140 and 140_$i$ REGISTER BLOCK

The invention claimed is:

1. A reconfigurable logic circuit comprising a plurality of logic blocks that include a full adder, two preposition logics that perform a plurality of logic operations according to configuration data, and an extended logic block that can perform the logic operation of one or more kinds, wherein
    outputs of the two preposition logics are respectively connected to two argument inputs of the full adder, and
    a carry output of the full adder is connected to the extended logic block, one selected from a plurality of signals including a fixed logic value according to the configuration data is input to a carry input of the full adder, and an extended logic block of a subsequent logic block generates an output signal according to an output of the extended logic block.

2. The reconfigurable logic circuit according to claim 1, wherein the preposition logic includes a multiplexer and an exclusive OR gate.

3. The reconfigurable logic circuit according to claim 1, wherein the preposition logic comprises a look-up table including a plurality of inputs.

4. The reconfigurable logic circuit according to claim 1, wherein the plurality of signals include a carry output of another full adder.

5. The reconfigurable logic circuit according to claim 1, wherein the extended logic block can perform the logic operation of two or more kinds according to the configuration data.

6. The reconfigurable logic circuit according to claim 1, wherein the extended logic block inputs the output of the extended logic block of a previous stage to one side, inputs the carry output of the full adder to another side, and can perform a logical AND operation or a logical AND operation with one input or output being inverted.

7. The reconfigurable logic circuit according to claim 1, wherein the extended logic block can perform at least a logical OR operation or a logical OR operation with one input or output being inverted.

8. The reconfigurable logic circuit according to claim 1, wherein the extended logic block includes a logical AND gate, a logical OR gate, a multiplexer, and a configuration memory, and selects and outputs an output of the logical AND gate or the logical OR gate according to content of the configuration memory.

9. The reconfigurable logic circuit according to claim 1, wherein the extended logic block includes a multiplexer and a configuration memory, and the configuration memory is connected to one input of the multiplexer.

10. The reconfigurable logic circuit according to claim 1, wherein the extended logic block is a look-up table including at least two inputs.

11. The reconfigurable logic circuit according to claim 2, wherein the plurality of signals include a carry output of another full adder.

12. The reconfigurable logic circuit according to claim 3, wherein the plurality of signals include a carry output of another full adder.

13. The reconfigurable logic circuit according to claim 2, wherein the extended logic block can perform the logic operation of two or more kinds according to the configuration data.

14. The reconfigurable logic circuit according to claim 3, wherein the extended logic block can perform the logic operation of two or more kinds according to the configuration data.

15. The reconfigurable logic circuit according to claim 4, wherein the extended logic block can perform the logic operation of two or more kinds according to the configuration data.

16. The reconfigurable logic circuit according to claim 2, wherein the extended logic block inputs the output of the extended logic block of a previous stage to one side, inputs the carry output of the full adder to another side, and can perform a logical AND operation or a logical AND operation with one input or output being inverted.

17. The reconfigurable logic circuit according to claim 3, wherein the extended logic block inputs the output of the extended logic block of a previous stage to one side, inputs the carry output of the full adder to another side, and can perform a logical AND operation or a logical AND operation with one input or output being inverted.

18. The reconfigurable logic circuit according to claim 4, wherein the extended logic block inputs the output of the extended logic block of a previous stage to one side, inputs the carry output of the full adder to another side, and can perform a logical AND operation or a logical AND operation with one input or output being inverted.

19. The reconfigurable logic circuit according to claim 5, wherein the extended logic block inputs the output of the extended logic block of a previous stage to one side, inputs the carry output of the full adder to another side, and can perform a logical AND operation or a logical AND operation with one input or output being inverted.

20. The reconfigurable logic circuit according to claim 2, wherein the extended logic block can perform at least a logical OR operation or a logical OR operation with one input or output being inverted.

* * * * *